United States Patent
Yamamoto (10) Patent No.: US 11,501,775 B2
(45) Date of Patent: Nov. 15, 2022

(54) VOICE SIGNAL CONTROL DEVICE, VOICE SIGNAL CONTROL SYSTEM, AND VOICE SIGNAL CONTROL PROGRAM

(71) Applicant: Toyota Jidosha Kabushiki Kaisha, Toyota (JP)

(72) Inventor: Katsuhiko Yamamoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 124 days.

(21) Appl. No.: 17/098,650

(22) Filed: Nov. 16, 2020

(65) Prior Publication Data

US 2021/0233526 A1   Jul. 29, 2021

(30) Foreign Application Priority Data

Jan. 23, 2020  (JP) .............................. JP2020-009262

(51) Int. Cl.
   *G10L 15/22*      (2006.01)
   *G10L 21/0316*   (2013.01)
   *G10L 15/30*      (2013.01)

(52) U.S. Cl.
   CPC .............. *G10L 15/22* (2013.01); *G10L 15/30* (2013.01); *G10L 21/0316* (2013.01); *G10L 2015/223* (2013.01)

(58) Field of Classification Search
   USPC .................................................... 704/1–504
   See application file for complete search history.

(56) References Cited

U.S. PATENT DOCUMENTS

| 10,805,730 | B2 * | 10/2020 | Sakurai | H04R 5/04 |
| 10,812,901 | B2 * | 10/2020 | Hirano | H04R 3/005 |
| 10,932,042 | B2 * | 2/2021 | Hirano | G10L 21/0232 |
| 2014/0233774 | A1 * | 8/2014 | Kim | H04R 25/558 381/315 |
| 2014/0324421 | A1 * | 10/2014 | Kim | H04N 21/43637 704/233 |
| 2017/0164089 | A1 * | 6/2017 | Lee | H04R 1/1025 |
| 2017/0264987 | A1 * | 9/2017 | Hong | H04R 1/1091 |
| 2018/0070291 | A1 * | 3/2018 | Breaux | B60K 35/00 |
| 2018/0176707 | A1 * | 6/2018 | Park | H04S 7/303 |
| 2019/0172461 | A1 * | 6/2019 | Jin | G10L 15/30 |
| 2019/0182749 | A1 * | 6/2019 | Breaux | H04W 4/027 |
| 2019/0228770 | A1 * | 7/2019 | Li | H04M 1/6016 |
| 2021/0183386 | A1 * | 6/2021 | Shi | G10L 15/1815 |
| 2021/0233526 | A1 * | 7/2021 | Yamamoto | G10L 15/30 |

FOREIGN PATENT DOCUMENTS

| CN | 109614628 A | 4/2019 |
| CN | 110073678 A | 7/2019 |
| JP | 2015-226090 A | 12/2015 |
| JP | 2016-063439 A | 4/2016 |
| WO | 2018/117588 A1 | 6/2018 |

* cited by examiner

*Primary Examiner* — Marcus T Riley
(74) *Attorney, Agent, or Firm* — Dinsmore & Shohl LLP (57) ABSTRACT

A voice signal control device includes a processor having hardware configured to process a voice signal generated by a voice signal generation device configured to generate the voice signal according to setting information of a voice output in a voice processing device configured to output the voice signal, and make the voice processing device output voice according to the voice signal after the processing.

17 Claims, 7 Drawing Sheets

VOICE SIGNAL CONTROL DEVICE, VOICE SIGNAL CONTROL SYSTEM, AND VOICE SIGNAL CONTROL PROGRAM

CROSS-REFERENCE TO RELATED APPLICATIONS

This application claims priority to Japanese Patent Application No. 2020-009262 filed on Jan. 23, 2020, which is incorporated herein by reference in its entirety including the specification, drawings and abstract.

BACKGROUND

1. Technical Field

The present disclosure relates to a voice signal control device, a voice signal control system, and a voice signal control program.

2. Description of Related Art

As an in-vehicle communication technique, for example, a technique that makes voice output from a speaker at a predetermined distance with respect to a position of an utterance source in order to transmit voice from an occupant on a front-side seat to an occupant on a rear-side seat is known (for example, Japanese Unexamined Patent Application Publication No. 2016-63439 (JP 2016-63439 A)).

SUMMARY

Incidentally, as the in-vehicle communication technique, there has been a demand for a technique that can transmit voice to an occupant who wears a voice processing device, such as a hearing aid or an earphone, in a vehicle cabin.

The present disclosure provides a voice signal control device, a voice signal control system, and a voice signal control program that can transmit voice to an occupant who wears a voice processing device in a vehicle cabin.

A first aspect of the present disclosure relates to a voice signal control device. The voice signal control device includes a processor having hardware. The processor is configured to process a voice signal generated by a voice signal generation device configured to generate the voice signal according to setting information of a voice output in a voice processing device configured to output the voice signal, and make the voice processing device output voice according to the voice signal after the processing.

A second aspect of the present disclosure relates to a voice signal control system. The voice signal control system includes a first device, a second device, and a third device. The first device includes a first processor having hardware. The second device includes a second processor having hardware. The third device includes a third processor having hardware. The first processor is configured to generate a voice signal based on collected voice and transmit the voice signal to the outside. The second processor is configured to output voice based on the voice signal. The third processor is configured to process the voice signal generated by the first processor according to setting information of a voice output in the second device, and make the second device output voice according to the voice signal after the processing.

A third aspect of the present disclosure relates to a voice signal control program. The voice signal control program causes a processor having hardware to execute processing a voice signal generated by a voice signal generation device configured to generate the voice signal according to setting information of a voice output in a voice processing device configured to output the voice signal, and making the voice processing device output voice according to the voice signal after the processing.

According to the present disclosure, it is possible to transmit voice to an occupant who wears a voice processing device in a vehicle cabin.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Hereinafter, an embodiment of the present disclosure will be described referring to the drawings. In all drawings of the following embodiment, the same or corresponding portions are represented by the same reference numerals. The present disclosure is not limited to the following embodiment.

Embodiment 1

Figure 1:
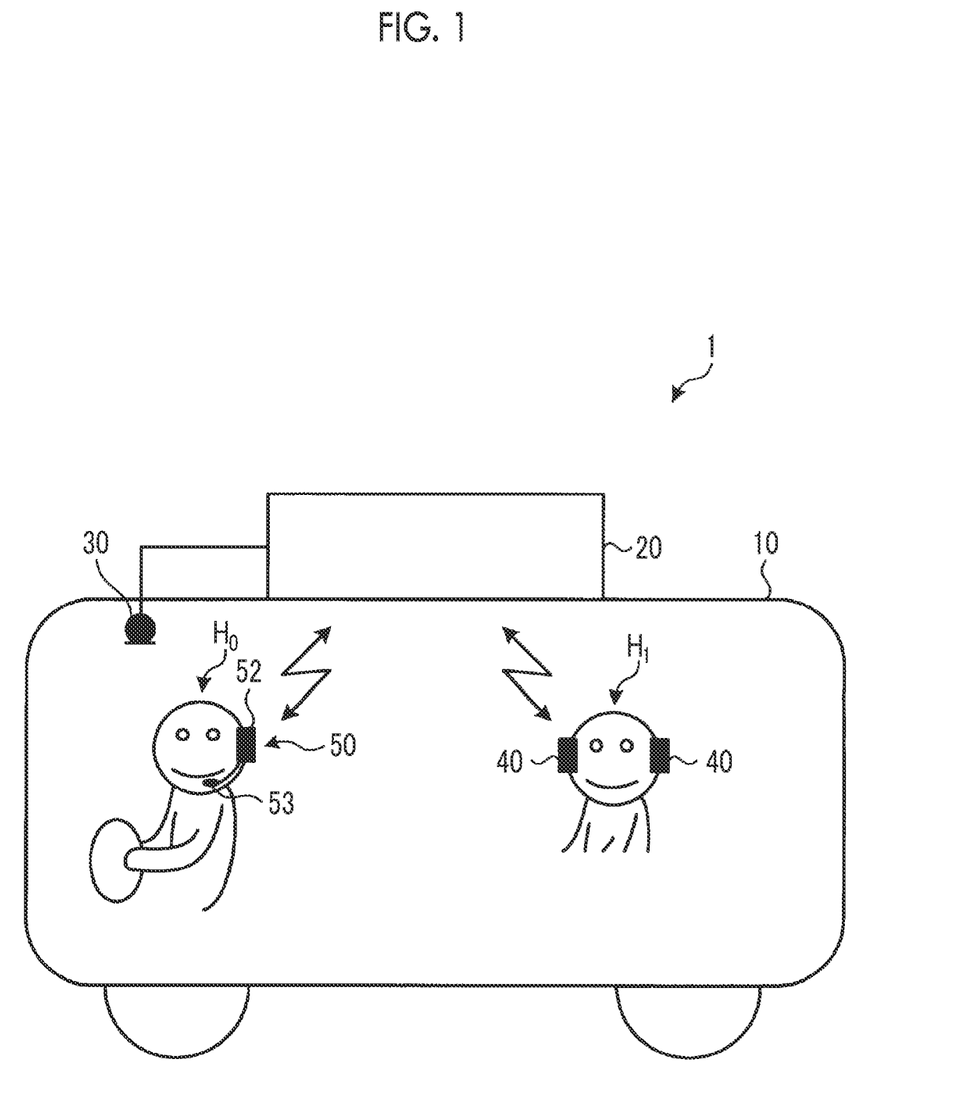
FIG. 1 is a schematic view showing a voice signal control system including a voice signal control device according to Embodiment 1 of the present disclosure.

First, a voice signal control system including a voice signal control device according to Embodiment 1 of the present disclosure will be described. FIG. 1 is a schematic view showing a voice signal control system including a voice signal control device according to Embodiment 1 of the present disclosure. A voice signal control system 1 shown in FIG. 1 is provided in a vehicle, and controls, for example, a voice output between a driver or an in-vehicle announcement and an occupant.

The voice signal control system 1 includes a vehicle 10, a voice signal control device 20, an in-vehicle microphone 30, a hearing aid 40 that is worn by an occupant $H_1$, and a headset 50 that is worn by a driver $H_0$. The in-vehicle microphone 30 and the headset 50 correspond to a voice signal generation device.

Figure 2:
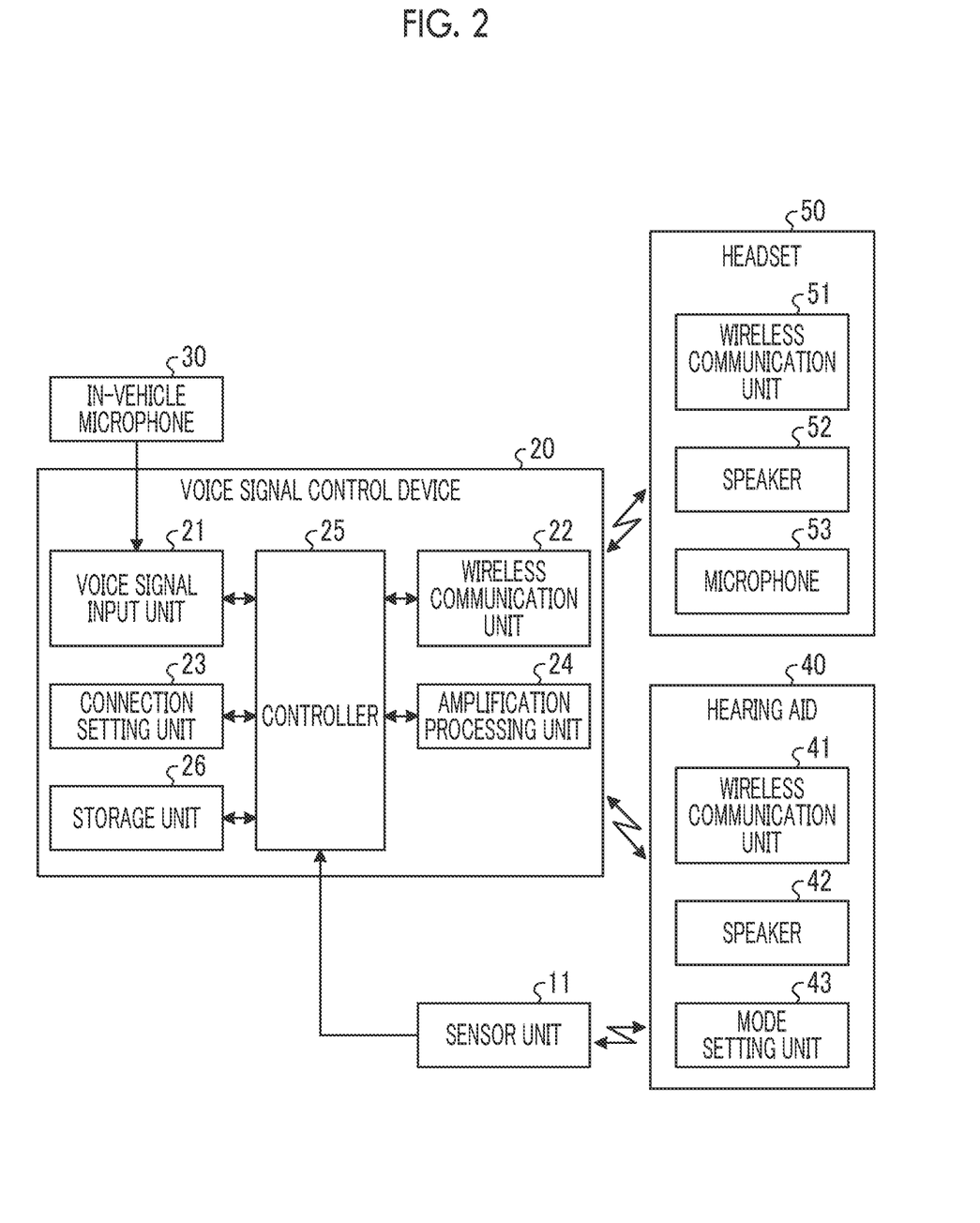
FIG. 2 is a block diagram schematically showing the configuration of the voice signal control system according to Embodiment 1 of the present disclosure.

FIG. 2 is a block diagram schematically showing the configuration of a voice signal control system. As shown in FIG. 2, the voice signal control device 20 includes a voice signal input unit 21, a wireless communication unit 22, a connection setting unit 23, an amplification processing unit 24, a controller 25, and a storage unit 26.

The voice signal input unit 21 receives a voice signal based on utterance input to the in-vehicle microphone 30 as input.

The wireless communication unit 22 performs wireless communication with the hearing aid 40 or the headset 50.

The connection setting unit 23 performs a connection setting to a voice processing device (for example, the hearing aid 40 of the occupant $H_1$) of an occupant who boards the vehicle 10 and wears the voice processing device. As the connection setting performed by the connection setting unit 23, there are a setting of a voice processing device as a communication target, acquisition (registration) of unique information of the device, and the like. The connection setting unit 23 is constituted using a processor, such as a central processing unit (CPU), a digital signal processor (DSP), or a field-programmable gate array (FPGA).

The amplification processing unit 24 executes amplification processing on the voice signal input to the voice signal input unit 21. With the amplification processing, the amplitude of the signal is amplified, and sound output from the voice processing device becomes loud. The amplification processing unit 24 is constituted using an amplifier or the like.

The controller 25 integrally controls the operations of various components mounted in the voice signal control device 20. The controller 25 specifically includes a processor, such as a CPU, a DSP, or an FPGA, and a main storage unit, such as a random access memory (RAM) or a read only memory (ROM). The controller 25 loads a program stored in the storage unit 26 on a work area and executes the program, thereby controlling the components and the like through the execution of the program.

The storage unit 26 stores information relating to the voice processing device, such as a hearing aid or an earphone (audio player), which can be worn by the occupant, for example, codec information for each model in an updatable manner. The storage unit 26 is physically constituted of a storage medium selected from a volatile memory, such as a RAM, a nonvolatile memory, such as a ROM, an erasable programmable ROM (EPROM), a hard disk drive (HDD), removable media, and the like. The storage unit 26 is constituted of a storage medium selected from a hard disk drive (HDD), removable media, and the like. The removable media are, for example, a universal serial bus (USB) memory or a disc recording medium, such as a compact disc (CD), a digital versatile disc (DVD), or Blu-ray (Registered Trademark) Disc (BD). The storage unit 26 may be constituted using a computer-readable recording medium, such as a memory card loadable from the outside. The storage unit 26 can store an operating system (OS), various programs, various tables, various databases, and the like for executing the operation of driving assistance processing. Various programs also include a model update processing program according to the embodiment. Various programs may be recorded on a computer-readable recording medium, such as a hard disk, a flash memory, a CD-ROM, a DVD-ROM, or a flexible disk, and may be widely distributed.

The vehicle 10 is provided with a sensor unit 11 that can perform communication with the voice processing device (hearing aid 40). The sensor unit 11 is provided in a door of the vehicle 10, for example, an entrance when the vehicle 10 is a bus. The sensor unit 11 outputs information relating to the voice processing device acquired through communication to the controller 25 as a detection signal.

The in-vehicle microphone 30 inputs a voice signal generated by collecting voice to the voice signal control device 20 (voice signal input unit 21).

The hearing aid 40 has a wireless communication unit 41, a speaker 42, and a mode setting unit 43. The wireless communication unit 41 performs wireless communication with the sensor unit 11 or the wireless communication unit 22.

The speaker 42 amplifies and outputs sound collected by the hearing aid 40.

The mode setting unit 43 changes a setting of a mode for outputting voice according to a control signal received from the voice signal control device 20. In Embodiment 1, the mode setting unit 43 sets any one of a normal output mode where collected voice is amplified and made to be output from the speaker 42 and a standby mode where standby is performed for an input of the voice signal transmitted from the voice signal control device 20 and voice according to the input voice signal is output. Here, in the standby mode, an amplification factor of the volume of collected ambient voice is turned down or turned off.

The hearing aid 40 stores unique information, such as model information (individual number) of the hearing aid 40, the amplification factor of the voice signal, and information relating to codec. Instead of the amplification factor of the voice signal, information capable of calculating a degree to be amplified, such as a degree of hardness of hearing or a set volume, may be provided.

The headset 50 has a wireless communication unit 51, a speaker 52, and a microphone 53.

The wireless communication unit 51 performs wireless communication with the wireless communication unit 22.

The sensor unit 11 and the wireless communication units 22, 41, 51 are constituted using near field communication (NFC) devices.

Figure 3:
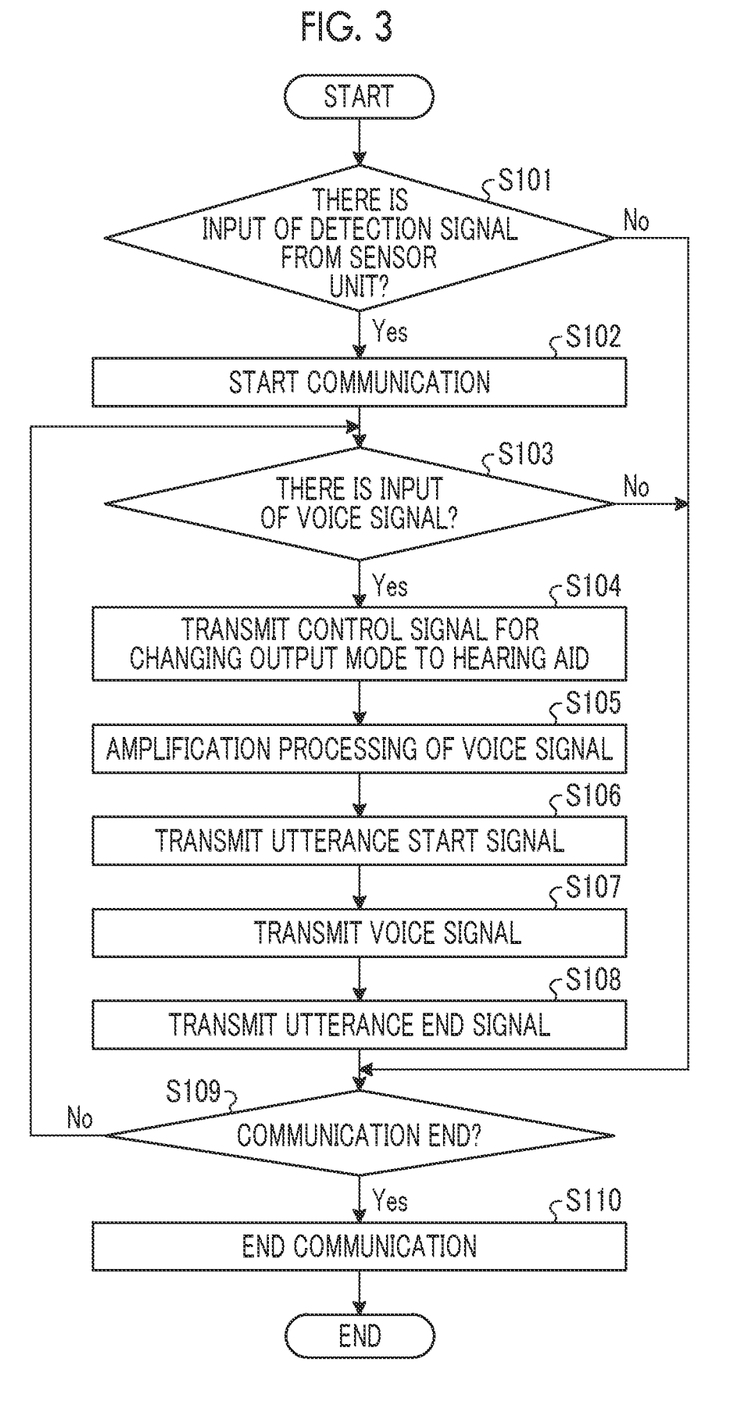
FIG. 3 is a diagram illustrating a flow of voice signal control in the voice signal control system according to Embodiment 1 of the present disclosure.

Subsequently, voice signal processing that is executed by the voice signal control device 20 will be described referring to FIG. 3. FIG. 3 is a diagram illustrating a flow of voice signal control in the voice signal control system according to Embodiment 1 of the present disclosure. In the processing shown in FIG. 3, a case where a driver makes an announcement regarding a destination or a next stop toward a passenger (occupant) in the vehicle 10 is exemplified.

In Step S101, the controller 25 determines whether or not there is an input of the detection signal relating to the voice processing device from the sensor unit 11. When determination is made that there is no input of the detection signal from the sensor unit 11 (Step S101: No), the controller 25 repeats confirmation processing of the detection signal. On the other hand, when determination is made that there is an input of the detection signal from the sensor unit 11 (Step S101: Yes), the controller 25 progresses to Step S102.

In Step S102, the connection setting unit 23 performs the connection setting to the voice processing device (in this case, the hearing aid 40) based on the detection signal and starts communication between the hearing aid 40 and the voice signal control device 20. The connection setting unit 23 sets the hearing aid 40 as a communication target. In this case, when communication with the hearing aid 40 is the first, the voice signal control device 20 may execute an authentication process of the hearing aid 40 and may execute initial registration processing of acquiring the unique information from the hearing aid 40. After the connection setting or the authentication process is completed, the voice signal control device 20 transmits a completion notification signal and makes the hearing aid 40 output completion notification sound. Hereinafter, an example where the voice processing device is the hearing aid 40 will be described.

In Step S103, the controller 25 determines whether or not there is an input of the voice signal in the voice signal input unit 21 or the wireless communication unit 22. Here, when determination is made that there is an input of the voice signal (Step S103: Yes), the controller 25 progresses to Step S104. When determination is made that there is no input of the voice signal (Step S103: No), the controller 25 progresses to Step S109.

In Step S104, the controller 25 transmits a control signal for changing a mode of a voice output to the hearing aid 40. The hearing aid 40 that receives the control signal changes the set mode from the normal output mode to the standby mode.

In Step S105, the amplification processing unit 24 amplifies the amplitude of the input voice signal. The amplification processing unit 24 amplifies the signal based on an individual profile of the hearing aid 40, such as hearing acuity information or information relating to the amplification factor acquired from the hearing aid 40.

In Step S106, the controller 25 transmits an utterance start signal for guiding a start of transmission of the voice signal to the hearing aid 40. In a case where the utterance start signal is received, the hearing aid 40 makes the speaker 42 output the subsequently received voice signal.

The processing of Steps S105 and S106 may be executed in such a manner that the processing of Step S106 is executed earlier or may be executed simultaneously.

In Step S107, the controller 25 transmits the voice signal after amplification to the hearing aid 40 through the wireless communication unit 22. In the hearing aid 40, voice according to the received voice signal is output from the speaker 42. When the vehicle 10 is a bus, for example, a next stop, a needed time to the stop, a current place, a last stop, and the like are announced through the hearing aid 40.

In Step S108, in a case where the utterance of the driver ends, the controller 25 transmits an utterance end signal for guiding an end of utterance to the hearing aid 40. In a case where the utterance end signal is received, the hearing aid 40 stops the voice output of the speaker 42.

The start of utterance of the driver is triggered by an operation, such as depression of an utterance button provided around the driver, for example, a steering wheel, or a voice input of a word that enables recognition of an utterance start. The end of utterance of the driver is triggered by an operation, such as depression of an utterance end button provided around the driver or a voice input of a word that enables recognition of an utterance end, or an elapsed time from final utterance. Besides, a speech button may be provided around the driver and a voice input may be validated while the speech button is depressed. When the speech button is provided, the utterance start signal is transmitted after button depression, and in a case where the depression of the button is released, the utterance end signal is transmitted.

In Step S109, the controller 25 determines whether or not to end communication with the hearing aid 40. When determination is made to continue communication with the hearing aid 40 without an end, the controller 25 returns to Step S103. In contrast, when determination is made to end communication with the hearing aid 40, the controller 25 progresses to Step S110.

The controller 25 makes the voice signal control device 20 and hearing aid 40 perform a small amount of data communication regularly, for example, after a communication start, and when communication is interrupted and data is not arrived from the hearing aid 40, determines to end communication. In a case where the occupant unboards and the occupant is physically away from the vehicle 10, data communication with the voice signal control device 20 is interrupted. The controller 25 determines whether or not a communication end is needed based on a status of data communication.

In Step S110, the connection setting unit 23 ends communication with the hearing aid 40 by releasing the connection setting to the hearing aid 40, and ends the processing. In this case, the hearing aid 40 also determines whether or not an end of communication is needed as in Step S109, and when communication ends, the mode setting unit 43 sets the voice output mode to the normal output mode. The hearing aid 40 may switch the voice output mode from the standby mode to the normal output mode after the reception of the utterance end signal in Step S108.

In Embodiment 1 described above, a configuration is made in which communication is performed between the voice processing device worn by the occupant and the voice signal control device 20, and voice collected by the microphone is made to be output from the speaker of the voice processing device as a communication target. According to Embodiment 1, since the device worn by the occupant outputs voice output into a vehicle cabin, it is possible to transmit voice to the occupant who wears the voice processing device in the vehicle cabin.

Embodiment 2

Figure 4:
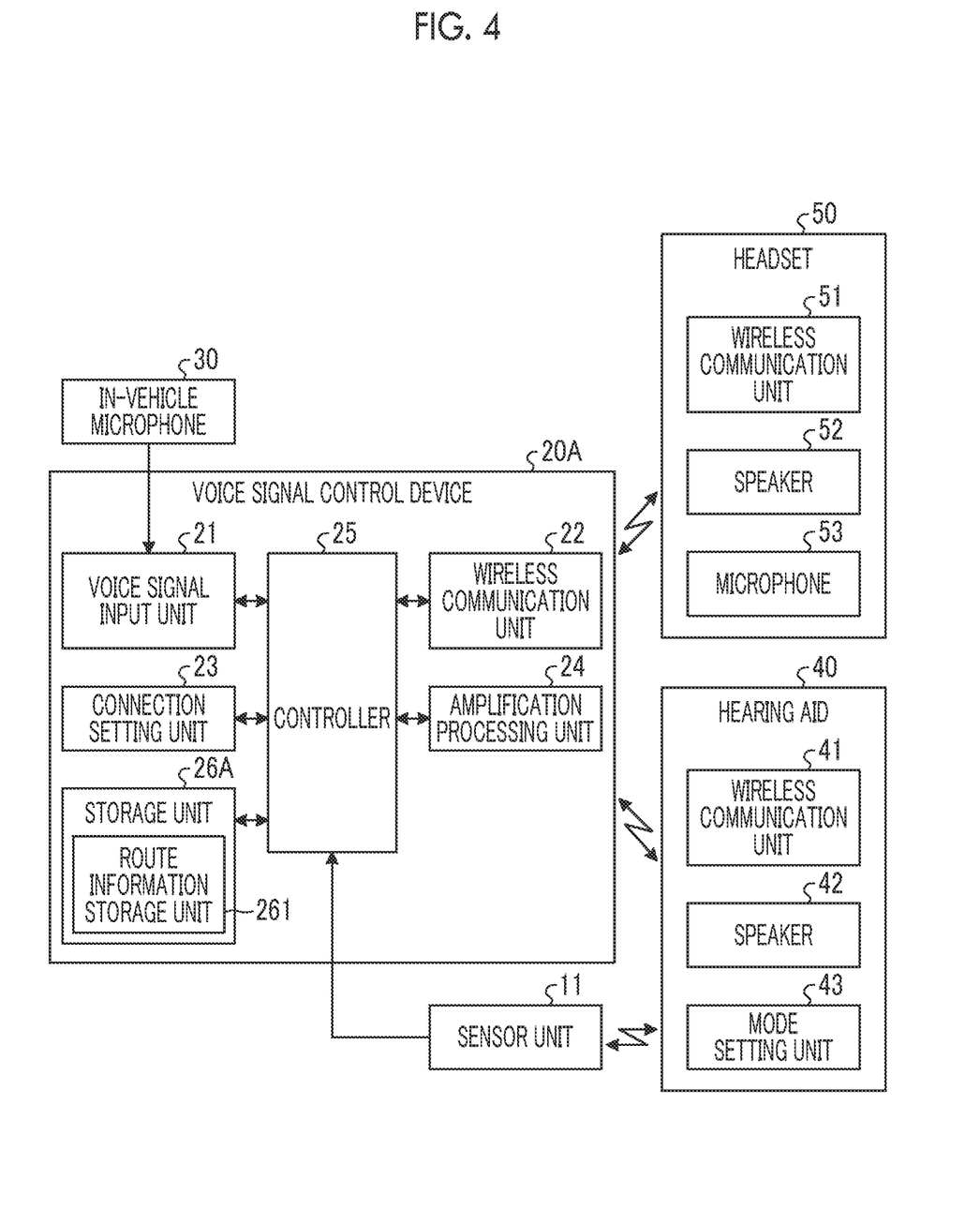
FIG. 4 is a block diagram schematically showing the configuration of a voice signal control system according to Embodiment 2 of the present disclosure.

Next, Embodiment 2 will be described referring to FIG. 4. FIG. 4 is a block diagram schematically showing the configuration of a voice signal control system according to Embodiment 2 of the present disclosure. The same configurations as those of the voice signal control system according to Embodiment 1 described above are represented by the same reference numerals.

The voice signal control system includes a vehicle 10, a voice signal control device 20A, an in-vehicle microphone 30, a hearing aid 40 that is worn by an occupant $H_1$, and a headset 50 that is worn by a driver $H_0$. The vehicle 10 according to Embodiment 2 is any vehicle of a bus, a taxi, or a ridesharing vehicle.

The voice signal control device 20A includes a voice signal input unit 21, a wireless communication unit 22, a connection setting unit 23, an amplification processing unit 24, a controller 25, and a storage unit 26A. The storage unit 26A has a route information storage unit 261. When the vehicle is a bus, the route information storage unit 261 stores, for example, a traveling route of the bus and stops in advance.

Here, a flow of basic voice signal processing is the same as the flowchart shown in FIG. 3. In Embodiment 2, a voice signal in Step S107 is not the utterance of the driver, and is route information stored in the route information storage unit 261. In Step S107, information regarding a route according to a position of the vehicle 10 is transmitted to the voice processing device every time, and is output in the voice processing device. An utterance start signal and an utterance end signal in Embodiment 2 are transmitted before and after the transmission of the voice signal as the route information. When the driver changes the route intentionally, it is possible to make an announcement through utterance in the same manner as described in Embodiment 1.

In Embodiment 2 described above, as in Embodiment 1, a configuration is made in which communication is performed between the voice processing device worn by the occupant and the voice signal control device 20, and the route information stored in advance is made to be output from the speaker of the voice processing device as a communication target. According to Embodiment 2, since the device worn by the occupant outputs voice output into the vehicle cabin, it is possible to transmit voice to the occupant who wearing the voice processing device in the vehicle cabin.

Embodiment 3

Figure 5:
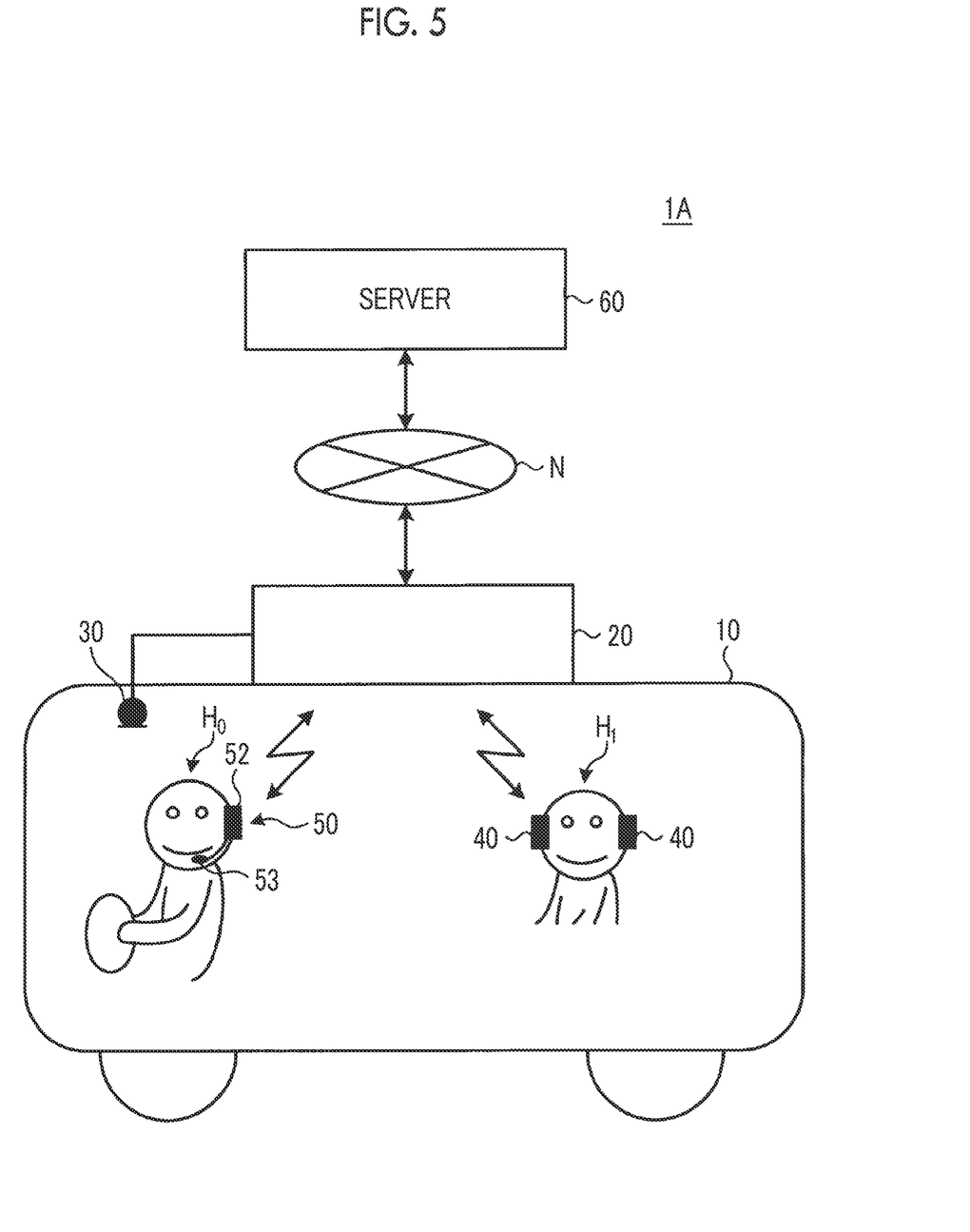
FIG. 5 is a schematic view showing a voice signal control system including a voice signal control device according to Embodiment 3 of the present disclosure.

Next, Embodiment 3 will be described referring to FIGS. 5 and 6. FIG. 5 is a schematic view showing a voice signal control system including a voice signal control device according to Embodiment 3 of the present disclosure. The same configurations as those of the voice signal control system according to Embodiment 1 described above are represented by the same reference numerals.

A voice signal control system 1A shown in FIG. 5 includes a vehicle 10, a voice signal control device 20, an in-vehicle microphone 30, a hearing aid 40 that is worn by an occupant $H_1$, a headset 50 that is worn by a driver $H_0$, and a server 60. The voice signal control device 20 and the server 60 transmit and receive signals through a network N.

The server 60 outputs various kinds of information in response to a request from the voice signal control device 20. In Embodiment 3, an example where a language of the occupant who wears the voice processing device (in this case, the hearing aid 40) is different from a language uttered by the driver will be described. A flow of basic voice signal processing is the same as the flowchart shown in FIG. 3. In the voice signal control device 20, the language uttered by the driver is registered.

The voice signal control device 20 acquires the unique information (unique number) of the hearing aid 40 from the hearing aid 40 in performing communication with the hearing aid 40 and transmits the unique information to the server 60. The server 60 reads information regarding an amplification factor and a communication language from the received unique information. In this case, when the communication language of the person who wears the hearing aid 40 is different from the language uttered by the driver, the server 60 converts a language expressed by voice. In the server 60, the language expressed by voice is converted based on the received voice signal and information regarding the communication language, and the voice signal after conversion is transmitted to the voice signal control device 20. That is, in the voice signal control device 20, in a case where there is an input of uttered voice from the driver to the voice signal input unit 21 or the wireless communication unit 22, the server 60 is made to convert the language, and the voice signal after conversion is amplified and output to the hearing aid 40. In this case, the voice signal control device 20 acquires information (hearing acuity information or amplification factor) relating to the amplification factor from the server 60. In a case where the amplification factor and the communication language are registered by initial registration, the unique information does not needed to be acquired every time.

In a case where the voice signal after conversion is received from the server 60, the voice signal control device 20 transmits the utterance start signal to the hearing aid 40, and sequentially transmits the voice signal after conversion to the hearing aid 40. Thereafter, in a case where determination is made that the utterance of the driver ends, the voice signal control device 20 transmits the utterance end signal to the hearing aid 40.

Figure 6:
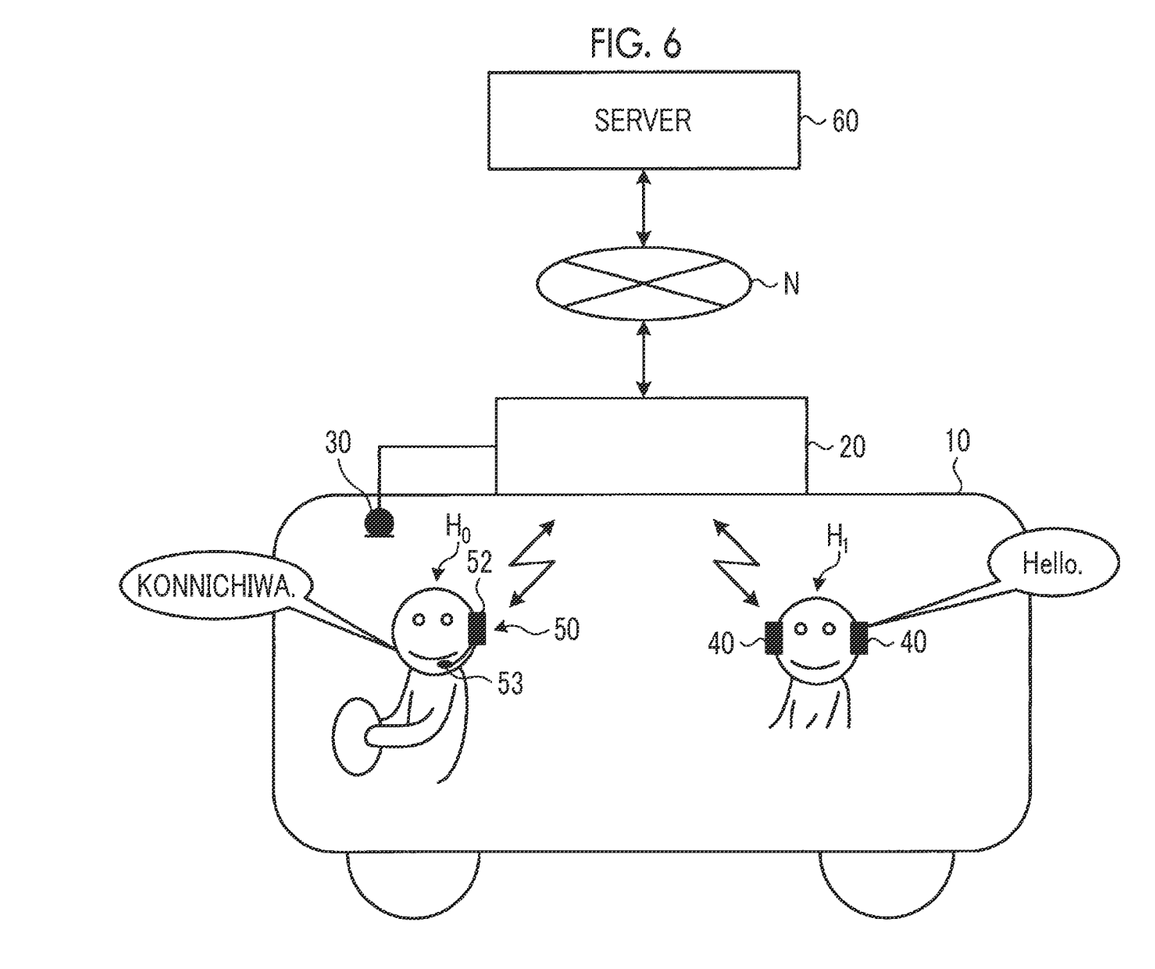
FIG. 6 is a diagram illustrating voice signal control in the voice signal control system according to Embodiment 3 of the present disclosure.

FIG. 6 is a diagram illustrating voice signal control in the voice signal control system according to Embodiment 3 of the present disclosure. For example, when the communication language of the occupant $H_1$ who wears the hearing aid 40 is English and the driver $H_0$ utters "Konnichiwa." to the microphone 53, voice "Hello." converted by the server 60 is output to the hearing aid 40.

In Embodiment 3 described above, as in Embodiment 1, a configuration is made in which communication is performed between the voice processing device worn by the occupant and the voice signal control device 20, and voice collected by the microphone is made to be output from the speaker of the voice processing device as a communication target. According to Embodiment 3, since the device worn by the occupant outputs voice output into the vehicle cabin, it is possible to transmit voice to the occupant who wears the voice processing device in the vehicle cabin.

In addition, in Embodiment 3, even though the languages of an utterance side and a listening side are different, since the language is converted by the server 60 and an announcement is output by the language after conversion in the voice processing device, such as the hearing aid 40, it is possible to appropriately transmit utterance.

In Embodiment 3, the voice signal control device 20 may refer to information regarding the communication language from the unique information in performing the connection setting of the hearing aid 40. In this case, when the communication language is different from the language uttered by the driver, the controller 25 transmits the voice signal to the server 60 to request conversion of the language expressed by voice. In the server 60, the language of voice is converted based on the received voice signal and language information, and the voice signal after conversion is transmitted to the voice signal control device 20.

In Embodiment 3, in a case where the voice signal control device 20 has a function of language conversion, even though the voice signal control device 20 does not access the server 60 to request conversion, it is possible to execute the above-described processing among the voice signal control device 20, the hearing aid 40, and the headset 50.

In Embodiment 3, it is possible to perform the guidance of the route described in Embodiment 2 based on information provided from the server 60.

The function of the connection setting unit 23 may be provided in the server 60, and communication between the voice signal control device 20 and the hearing aid 40 may be mediated under the control of the server 60.

Embodiment 4

Figure 7:
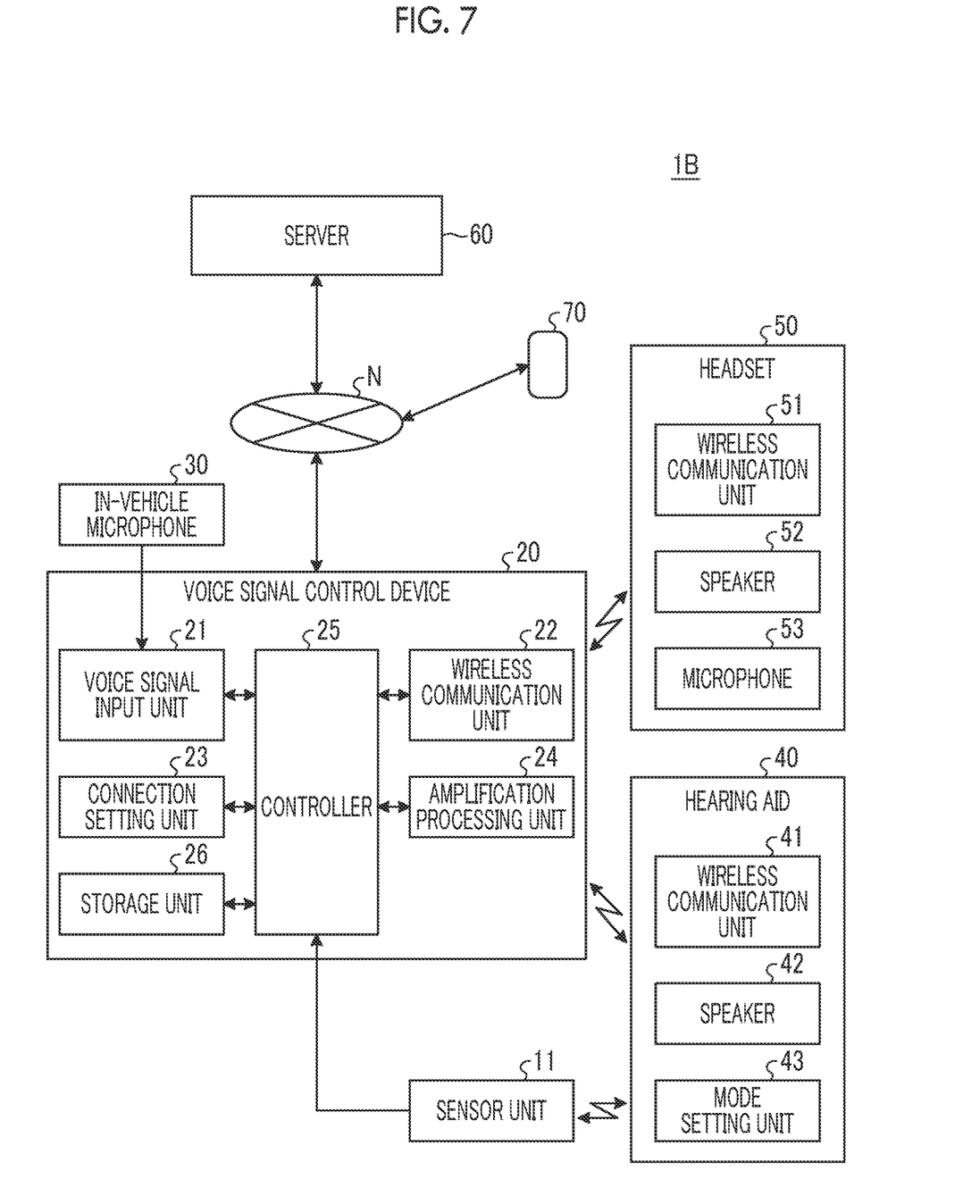
FIG. 7 is a block diagram schematically showing the configuration of a voice signal control system according to Embodiment 4 of the present disclosure.

Next, Embodiment 4 will be described referring to FIG. 7. FIG. 7 is a block diagram schematically showing the configuration of a voice signal control system according to Embodiment 4 of the present disclosure. The same configurations as those of the voice signal control system according to Embodiment 1 described above are represented by the same reference numerals.

A voice signal control system 1B shown in FIG. 7 includes a vehicle 10, a voice signal control device 20, an in-vehicle microphone 30, a hearing aid 40 that is worn by an occupant $H_1$, a headset 50 that is worn by a driver $H_0$, a server 60, and a user terminal 70. The voice signal control device 20, the server 60, and the user terminal 70 transmit and receive signals through a network N. In Embodiment 4, an example where the person who wears the hearing aid 40 uses ridesharing using an application of the user terminal 70 will be described.

The user terminal 70 is a computer terminal that is used by a user. As the user terminal 70, for example, a smartphone, a mobile phone, a tablet terminal, a wearable computer, or the like carried with the user is exemplified. The user terminal 70 may be any terminal as long as the terminal can exchange information with the server 60.

Hereinafter, an example where the user uses ridesharing using the user terminal 70 will be described. The user (occupant $H_1$) requests vehicle allocation using an application of the user terminal 70. In this case, the user registers that the user wears the hearing aid 40. The effect that the user wears the hearing aid 40 may be detected through communication between the hearing aid 40 and the user terminal 70. With this, information regarding the vehicle allocation request of the user is associated with information to the effect of the hearing aid user. In addition, a manufacturer, a model number, and a communication system of the hearing aid may be registered or a desire to the driver may be registered. The desire to the driver can be registered by checking of items set in advance or writing of the user. In the user terminal 70, past vehicle allocation information may be referred to and present request information may be created from a series of information.

The driver of the ridesharing vehicle recognizes that the hearing aid user will board upon confirming the vehicle allocation information.

Text data is distributed from the server 60 to the user terminal 70 while the user is on standby for the vehicle before boarding, and information regarding a position of the vehicle, a time until arrival, stop and departure time, and the like is displayed by text. In this way, when the user is the person who wears the hearing aid 40, visual information, such as text information, is distributed with priority, instead of voice.

A flow of basic voice signal processing in the vehicle 10 after the user boards is the same as the flowchart shown in FIG. 3. In Step S106, when the voice signal is transmitted from the voice signal control device 20 to the hearing aid 40, text data according to the content of the voice signal may be transmitted to the user terminal 70 simultaneously with the voice signal. The text information and the like is displayed on the user terminal 70, whereby it is possible to more reliably transmit an announcement. Text data may be transmitted from the user terminal 70, and information corresponding to text data may be displayed on a display screen of a navigation system or the like provided in the vehicle 10.

It is also possible to transmit an instruction or a desire from the occupant to the driver through the user terminal 70. For example, a voice signal based on voice input to the user terminal 70 by the occupant is transmitted to the headset 50 worn by the driver through the server 60. The headset 50 makes the speaker 52 output voice based on the received voice signal. As the instruction or the desire, there are "stop request", "destination change", "adjustment of air conditioning", "stopover at a convenience store", and the like.

In Embodiment 4 described above, as in Embodiment 1, a configuration is made in which communication is performed between the voice processing device worn by the occupant and the voice signal control device 20, and voice collected by the microphone is made to be output from the speaker of the voice processing device as a communication target. According to Embodiment 4, since the device worn by the occupant outputs voice output into the vehicle cabin, it is possible to transmit voice to the occupant who wears the voice processing device in the vehicle cabin.

In Embodiment 4, since the driver can ascertain in advance that there is the hearing aid user among the occupants based on request information of ridesharing, it is possible to allow the driver to prepare to handle the hearing aid user. As a result, it is possible to allow the driver to take appropriate handling according to the occupant, such as appropriately making an announcement to the occupant.

In Embodiments 1 to 4, although an example where the occupant who wears the hearing aid 40 is a transmission destination of the voice signal has been described, the present disclosure is not limited to the hearing aid, and can also be applied to a voice processing device, such as an earphone or a headphone, which is connected to a media player to output voice.

Other effects or modification examples can be easily derived by those skilled in the art. Broader aspects of the present disclosure are not limited to specific details and representative embodiments shown and described above. Accordingly, various alterations may be made without departing from the spirit or scope of the general present disclosure defined by the appended claims and equivalent thereof.

What is claimed is:

1. A voice signal control device comprising a processor having hardware configured to
   process a voice signal generated by a microphone configured to generate the voice signal according to setting information of a voice output in a hearing aid configured to output the voice signal, and
   make the hearing aid output voice according to the voice signal after the processing,
   wherein the processor is configured to, when there is an input of the voice signal from the microphone, set a mode of the voice output in the hearing aid to a standby mode in which the hearing aid is on standby for an input of the voice signal transmitted from the voice signal control device.

2. The voice signal control device according to claim 1, wherein the processor is configured to
   amplify the voice signal generated by the microphone, and
   make the hearing aid output voice according to the amplified voice signal.

3. The voice signal control device according to claim 1, wherein the processor is configured to make the hearing aid output voice obtained by converting a language expressed by voice input to the microphone into a language set in the hearing aid.

4. The voice signal control device according to claim 1, wherein the processor is configured to
   transmit an utterance start signal for guiding a start of transmission of the voice signal to the hearing aid in a state in which the hearing aid is set to the standby mode, and
   transmit an utterance end signal to the hearing aid when determination is made that the generation of the voice signal in the microphone ends.

5. The voice signal control device according to claim 1, wherein:
   communication is performed between the voice signal control device and the hearing aid after a start of communication with the hearing aid; and
   the processor is configured to determine whether or not to end communication with the hearing aid according to a communication state with the hearing aid.

6. A voice signal control system comprising:
a first device including a first processor having hardware;
a second device including a second processor having hardware; and
a third device including a third processor having hardware, wherein
the first processor is configured to generate a voice signal based on collected voice and transmit the voice signal outside,
the second processor is configured to output voice based on the voice signal, and
the third processor is configured to process the voice signal generated by the first processor according to setting information of a voice output in the second device, and make the second device output voice according to the voice signal after the processing,
wherein the third processor is configured to, when there is an input of the voice signal from the first device, set a mode of the voice output in the second device to a standby mode in which the second device is on standby for an input of the voice signal transmitted from the third device.

7. The voice signal control system according to claim 6, wherein the third processor is configured to
amplify the voice signal generated by the first device by an amplification factor set in the second device, and
make the second device output voice according to the amplified voice signal.

8. The voice signal control system according to claim 6, wherein the third processor is configured to make the second device output voice obtained by converting a language expressed by voice input to the first device into a language set in the second device.

9. The voice signal control system according to claim 6, wherein the third processor is configured to
transmit an utterance start signal for guiding a start of transmission of the voice signal to the second device in a state in which the second device is set to the standby mode, and
transmit an utterance end signal to the second device when determination is made that the generation of the voice signal in the first device ends.

10. The voice signal control system according to claim 6, wherein:
the second processor and the third processor perform data communication between the second device and the third device; and
the third processor is configured to determine whether or not to end communication according to a state of data communication with the second device.

11. The voice signal control system according to claim 6, wherein:
the second device is a hearing aid; and
the second processor is configured to set one mode of the standby mode and a normal output mode in which the collected voice is amplified and output.

12. The voice signal control system according to claim 11, wherein, in the standby mode, an amplification factor of the collected voice is turned down or an output of the collected voice is turned off.

13. A non-transitory storage medium causing a processor having hardware to execute:
processing a voice signal generated by a microphone configured to generate the voice signal according to setting information of a voice output in a hearing aid configured to output the voice signal;
making the hearing aid output voice according to the voice signal after the processing; and
when there is an input of the voice signal from the microphone, setting a mode of the voice output in the hearing aid to a standby mode in which the hearing aid is on standby for an input of the voice signal transmitted from a voice signal control device having the processor.

14. The non-transitory storage medium according to claim 13, causing the processor to execute:
amplifying the voice signal generated by the microphone configured to generate the voice signal; and
making the hearing aid output voice according to the amplified voice signal.

15. The non-transitory storage medium according to claim 13, causing the processor to execute making the hearing aid output voice obtained by converting a language expressed by voice input to the microphone into a language set in the hearing aid.

16. The non-transitory storage medium according to claim 13, causing the processor to execute:
transmitting an utterance start signal for guiding a start of transmission of the voice signal to the hearing aid in a state in which the hearing aid is set to the standby mode; and
transmitting an utterance end signal to the hearing aid when determination is made that the generation of the voice signal in the microphone ends.

17. The non-transitory storage medium according to claim 13, causing the processor to execute:
performing communication between a voice signal control device having the processor and the hearing aid after a start of communication with the hearing aid; and
determining whether or not to end communication with the hearing aid according to a communication state with the hearing aid.

* * * * *